(12) United States Patent
Yamada et al.

(10) Patent No.: US 11,214,017 B2
(45) Date of Patent: Jan. 4, 2022

(54) ULTRASONIC VIBRATION WELDING APPARATUS

(71) Applicant: Toshiba Mitsubishi-Electric Industrial Systems Corporation, Chuo-ku (JP)

(72) Inventors: Yoshihito Yamada, Tokyo (JP); Akihiro Ichinose, Tokyo (JP)

(73) Assignee: TOSHIBA MITSUBISHI-ELECTRIC INDUSTRIAL SYSTEMS CORPORATION, Tokyo (JP)

(*) Notice: Subject to any disclaimer, the term of this patent is extended or adjusted under 35 U.S.C. 154(b) by 0 days.

(21) Appl. No.: 16/610,139

(22) PCT Filed: Sep. 20, 2018

(86) PCT No.: PCT/JP2018/034713
§ 371 (c)(1),
(2) Date: Nov. 1, 2019

(87) PCT Pub. No.: WO2020/059061
PCT Pub. Date: Mar. 26, 2020

(65) Prior Publication Data
US 2020/0156328 A1 May 21, 2020

(51) Int. Cl.
*B29C 65/08* (2006.01)
*B29C 65/00* (2006.01)

(52) U.S. Cl.
CPC .......... *B29C 66/8322* (2013.01); *B29C 65/08* (2013.01); *B29C 66/7465* (2013.01); *B29C 66/9241* (2013.01); *B29C 66/9221* (2013.01)

(58) Field of Classification Search
CPC .. B29C 66/8322; B29C 66/9241; B29C 65/08
See application file for complete search history.

(56) References Cited

U.S. PATENT DOCUMENTS

| | | | |
|---|---|---|---|
| 4,145,236 A * | 3/1979 | Neumayer | B29C 66/81415 156/73.1 |
| 5,976,314 A | 11/1999 | Sans | |
| 6,491,785 B1 | 12/2002 | Sato et al. | |
| 2015/0068660 A1* | 3/2015 | Wang | B29C 66/90 156/64 |

FOREIGN PATENT DOCUMENTS

| | | | |
|---|---|---|---|
| CN | 105172128 A | * | 12/2015 |
| CN | 105172128 A | | 12/2015 |
| EP | 1 060 825 A1 | | 12/2000 |

(Continued)

OTHER PUBLICATIONS

Machine Translation of CN-105172128-A (Year: 2015).*

(Continued)

*Primary Examiner* — Daniel McNally
(74) *Attorney, Agent, or Firm* — Xsensus LLP

(57) ABSTRACT

An ultrasonic vibration welding apparatus includes an air cylinder that is coupled to an ultrasonic welding head unit and executes a pressurizing operation of pressurizing on the ultrasonic welding head unit, and a lifting-lowering servomotor that executes a lifting-lowering operation including a lowering operation of lowering the ultrasonic welding head unit and the air cylinder at once, as components separate from each other.

5 Claims, 9 Drawing Sheets

(56) References Cited

FOREIGN PATENT DOCUMENTS

| JP | 2001-1162 | A |   | 1/2001 |  |
|----|-----------|---|---|--------|--|
| JP | 2006-86345 | A |   | 3/2006 |  |
| JP | 2007-141972 | A |   | 6/2007 |  |
| JP | 2009-246185 | A |   | 10/2009 |  |
| JP | 2009246185 | A | * | 10/2009 | ............. H01L 24/75 |
| JP | 2011-9261 | A |   | 1/2011 |  |
| KR | 10-0352523 | B1 |   | 9/2002 |  |

OTHER PUBLICATIONS

Machine Translation of JP-2009246185-A (Year: 2009).*
International Search Report dated Nov. 20, 2018 in PCT/JP2018/034713 filed on Sep. 20, 2018.
Office Action dated May 25, 2020 in Taiwanese Patent Application No. 108116233, 12 pages.
Written Opinion of the International Searching Authority dated Nov. 20, 2018, issued in corresponding International Application No. PCT/JP2018/034713.
Office Action dated Aug. 19, 2020, in corresponding Taiwanese Application No. 108116233, 15 pages.
Office Action dated Jan. 21, 2020 in Japanese Patent Application No. 2019-528945, 9 pages.
Taiwanese Office Action dated Dec. 25, 2020, in corresponding Taiwanese Patent Application No. 108116233.
Examination Report dated Feb. 11, 2021, in Australian Application No. 2018422116.
Extended Search Report dated Feb. 15, 2021 in European Application No. 18925053.3.
Office Action dated Sep. 13, 2021, in corresponding Korean patent Application No. 10-2020-7009721, 11 pages.

* cited by examiner

F I G. 9
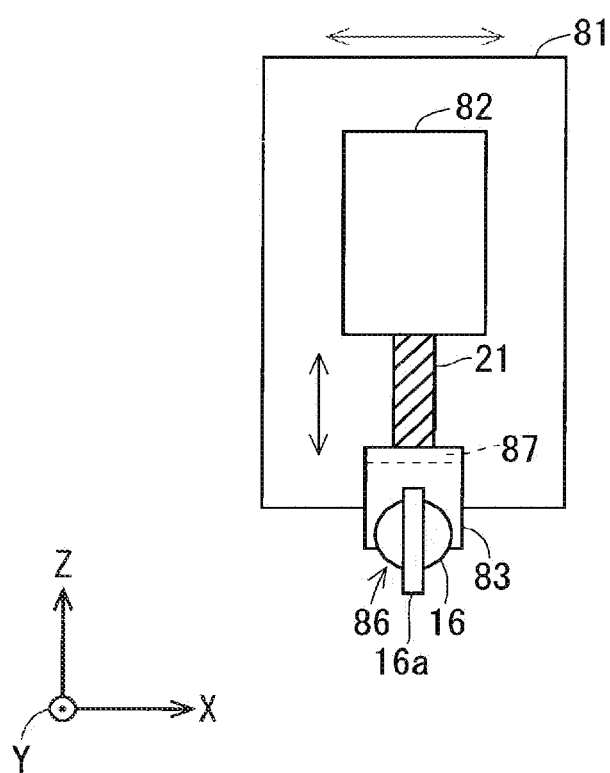

ULTRASONIC VIBRATION WELDING APPARATUS

TECHNICAL FIELD

The present invention relates to a pressurizing type ultrasonic vibration welding apparatus, and more particularly relates to an ultrasonic vibration welding apparatus applied, for example, when ultrasonic welding of an electrode having conductivity on a thin substrate is performed.

BACKGROUND ART

Conventionally, after disposing an electrode wire for collecting current on an upper surface of a substrate for a thin-film solar cell, in a step of welding the electrode wire to the substrate, an ultrasonic vibration welding apparatus has been used, which executes an ultrasonic welding process to apply ultrasonic waves while applying pressure to the electrode wire disposed on the substrate. As such an ultrasonic vibration welding apparatus, for example, there is a pressurizing type ultrasonic vibration welding apparatus disclosed in Patent Document 1.

FIG. 9 is an explanatory view schematically illustrating a structure of a conventional pressurizing type ultrasonic vibration welding apparatus. An XYZ orthogonal coordinate system is illustrated in FIG. 9.

As illustrated in the view, in a one-head traveling frame 81 movable in a horizontal direction (X direction), a lifting-lowering pressurizing servomotor 82 is fixed to a side surface having an XZ plane.

An upper end (+Z direction) of a screw shaft 21 is attached to the lifting-lowering pressurizing servomotor 82, and a lower end of the screw shaft 21 is attached to a lifting-lowering pressurizing slider 83 in a manner to be connected to the lifting-lowering pressurizing slider 83 via a nut that is not illustrated.

In such a configuration, by rotating the screw shaft 21 in a first rotation direction by driving the lifting-lowering pressurizing servomotor 82, a lowering operation of moving the lifting-lowering pressurizing slider 83 downward (−Z direction) can be performed.

On the other hand, by rotating the screw shaft 21 in a second rotation direction (a rotation direction opposite to the first rotation direction) by the lifting-lowering pressurizing servomotor 82, a lifting operation of moving the lifting-lowering pressurizing slider 83 upward (+Z direction) can be performed.

An ultrasonic welding head unit 86 is attached to a lower portion of the lifting-lowering pressurizing slider 83. The ultrasonic welding head unit 86 is formed extending in a head formation direction (Y direction), and has an ultrasonic welding portion 16a on a tip portion.

The ultrasonic welding head unit 86 executes an ultrasonic vibration operation of applying ultrasonic vibrations from the ultrasonic welding portion 16a.

In addition, the lifting-lowering pressurizing slider 83 has a pressure sensor 87 in an upper part thereof. As the pressure sensor 87, for example, a strain gauge is conceivable. The pressure sensor 87 can detect, as a measured pressure value, a pressurizing pressing force of the ultrasonic welding head unit 86 pressing the welding target such as an electrode wire disposed on the substrate.

As described above, since the ultrasonic welding head unit 86 is fixed to the lifting-lowering pressurizing slider 83, the lifting-lowering pressurizing servomotor 82 can perform a lifting-lowering operation (lifting operation+lowering operation) and a pressurizing operation, with the ultrasonic welding head unit 86 being an operating target.

That is, in a welding portion non-contact period in which the ultrasonic welding portion 16a is not in contact with the welding target, the lifting-lowering pressurizing servomotor 82 performs a lifting-lowering operation for the ultrasonic welding head unit 86, and in a welding portion contact period in which the ultrasonic welding portion 16a is in contact with the welding target, the lifting-lowering pressurizing servomotor 82 performs a pressurizing operation to the ultrasonic welding head unit 86.

The lowering operation and the lifting operation of the lifting-lowering pressurizing servomotor 82 and the ultrasonic vibration operation of the ultrasonic welding head unit 86 described above are executed under control of a control unit that is not illustrated.

In the conventional ultrasonic vibration welding apparatus having such a configuration, the following steps 1 to 4 are executed under control of the control unit.

step 1: The ultrasonic welding portion 16a of the ultrasonic welding head unit 86 is disposed to be located above an application portion of the welding target.

step 2: The screw shaft 21 is rotated in the first rotation direction by driving of the lifting-lowering pressurizing servomotor 82, thereby executing a lowering operation of moving the lifting-lowering pressurizing slider 83 and the ultrasonic welding head unit 86 downward.

step 3: When the pressure sensor 87 detects a welding portion contact state in which a lower tip portion of the ultrasonic welding portion 16a of the ultrasonic welding head unit 86 contacts an application portion of the welding target, a driving content of the lifting-lowering pressurizing servomotor 82 is controlled so that a pressurizing pressing force by the ultrasonic welding head unit 86 becomes a desired pressure value.

step 4: When it is recognized by the pressure sensor 87 that the pressurizing pressing force has reached the desired pressure value, the ultrasonic welding head unit 86 is caused to execute the ultrasonic vibration operation.

Note that in step 3, as a result of rising of the measured pressure value detected by the pressure sensor 87 from "0", the welding portion contact state can be detected.

Also, in step 4, when the measured pressure value detected by the pressure sensor 87 indicates the desired pressure value, it can be recognized that the pressurizing pressing force has reached the desired pressure value.

After the welding portion contact state is made, the welding target is pressurized by the pressurizing pressing force by the ultrasonic welding portion 16a of the ultrasonic welding head unit 86.

PRIOR ART DOCUMENTS

Patent Documents

Patent Document 1: Japanese Patent Application Laid-Open No. 2011-9261

SUMMARY

Problem to be Solved by the Invention

In this manner, the conventional ultrasonic vibration welding apparatus has performed the lifting-lowering operation (lifting operation and lowering operation) of the ultrasonic welding head unit 86 and the pressurizing operation of applying the pressurizing pressing force to the ultrasonic welding head unit 86 by driving the same lifting-lowering pressurizing servomotor 82.

For this reason, there has been a problem that control of driving of the lifting-lowering pressurizing servomotor 82 becomes relatively difficult. Specifically, a process (step 3) of detecting presence or absence of the welding portion contact state using the pressure sensor 87 and a process (step 4) of detecting that the pressurizing pressing force has become a desired pressure value are necessary. Thus, the conventional ultrasonic vibration welding apparatus has a problem that the control of driving of the lifting-lowering pressurizing servomotor 82 becomes difficult because two types of detection processes using the pressure sensor 87 are performed.

It is an object of the present invention to provide a structure of an ultrasonic vibration welding apparatus capable of solving problems as described above and relatively easily controlling the lowering operation and the pressurizing operation in the ultrasonic welding head unit.

Means to Solve the Problem

An ultrasonic vibration welding apparatus according to the present invention further includes a table on which a welding target is placed, an ultrasonic welding head unit that executes an ultrasonic vibration operation of applying ultrasonic vibrations from an ultrasonic welding portion, a pressurizing mechanism that is coupled to the ultrasonic welding head unit and executes a pressurizing operation of pressurizing the ultrasonic welding head unit toward the table side, a lowering mechanism that executes a lowering operation of lowering the ultrasonic welding head unit and the pressurizing mechanism at once, and a control unit that executes a control operation of controlling the ultrasonic vibration operation by the ultrasonic welding head unit, the pressurizing operation by the pressurizing mechanism, and the lowering operation by the lowering mechanism.

Effects of the Invention

An ultrasonic vibration welding apparatus, which is the present invention according to claim 1, includes a pressurizing mechanism that executes a pressurizing operation of applying a pressurizing pressing force to an ultrasonic welding head unit, and a lowering mechanism that executes a lowering operation of lowering the ultrasonic welding head unit, and thus the lowering operation and the pressurization operation can be individually performed with the ultrasonic welding head unit being an operating target.

As a result, the ultrasonic vibration welding apparatus of the present invention can relatively easily execute the lowering operation and the pressurizing operation under control of the control unit, so as to perform the ultrasonic welding process on the welding target.

Furthermore, since the pressurizing mechanism does not need to have the function of lowering the ultrasonic welding head unit, the pressurizing operation can be executed with a pressurizing pressing force that is always constant. Thus, the pressurizing mechanism can be set to a highly accurate pressurizing pressing force without providing a pressure sensor that measures the pressurizing pressing force.

The objects, features, aspects and advantages of the present invention will be more apparent from the following detailed description and the accompanying drawings.

BRIEF DESCRIPTION OF DRAWINGS

FIG. 9 is an explanatory view schematically illustrating a structure of a conventional pressurizing type ultrasonic vibration welding apparatus.

DESCRIPTION OF EMBODIMENTS

First Embodiment (Basic Configuration)

Figure 1:
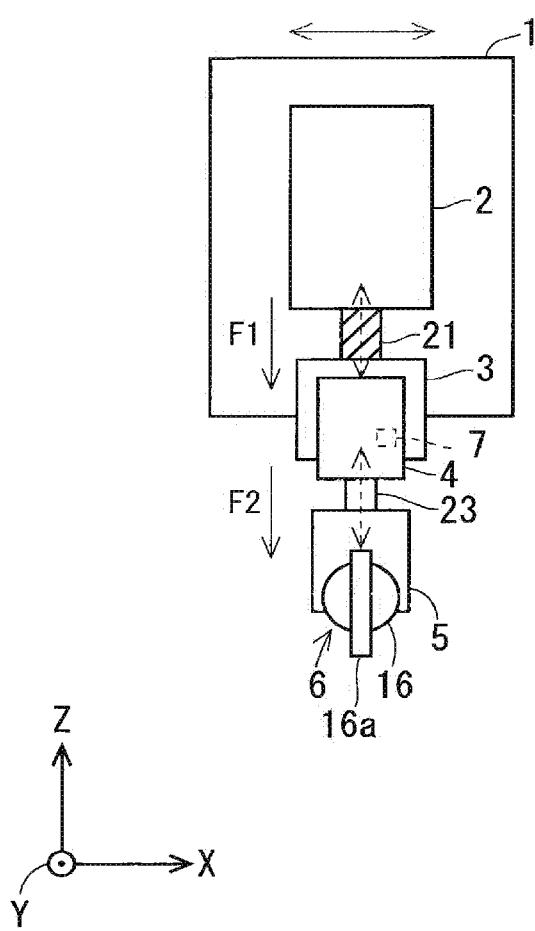
FIG. 1 is an explanatory view schematically illustrating a structure of an ultrasonic vibration welding apparatus according to a first embodiment of the present invention.
Figure 2:
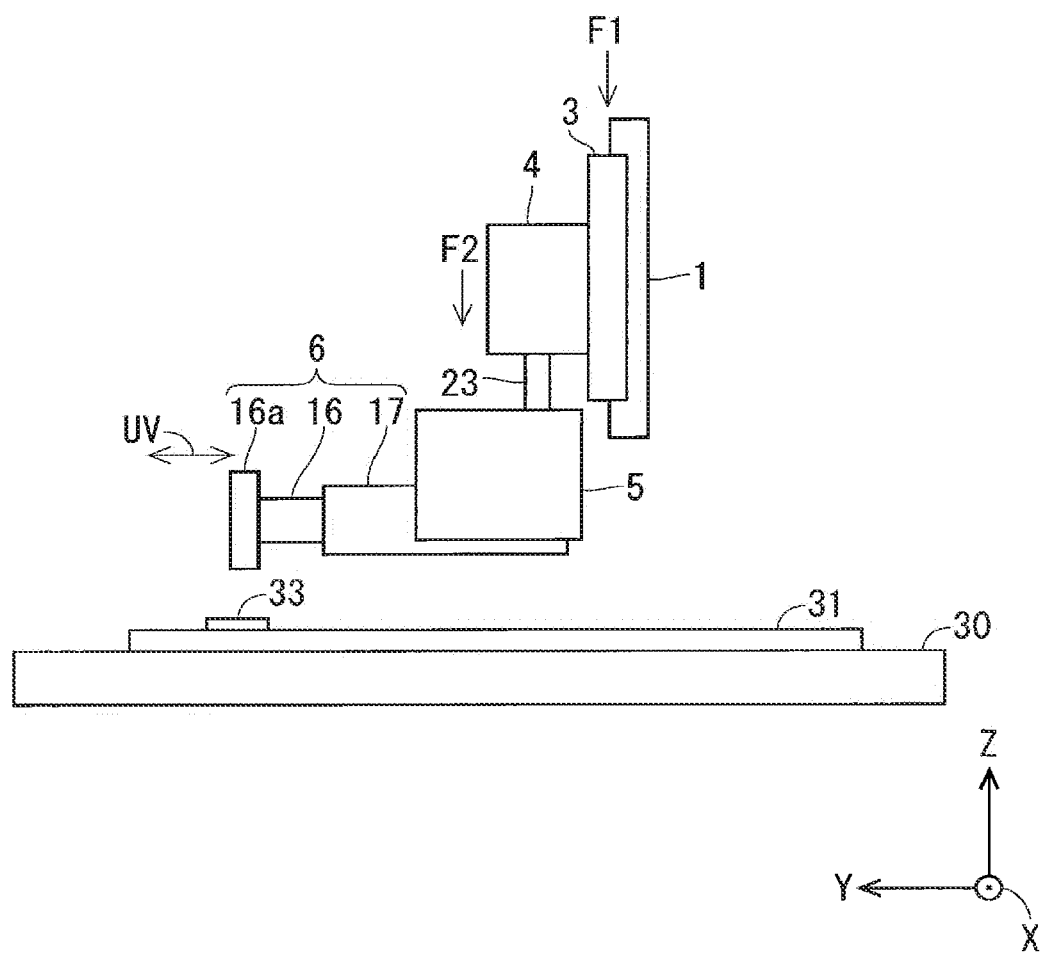
FIG. 2 is an explanatory view schematically illustrating a part of the structure of the ultrasonic vibration welding apparatus according to the first embodiment.

FIG. 1 is an explanatory view schematically illustrating a structure of an ultrasonic vibration welding apparatus as a first embodiment of the present invention. FIG. 2 is an explanatory view schematically illustrating a part of the structure of the ultrasonic vibration welding apparatus according to the first embodiment. An XYZ orthogonal coordinate system is illustrated in each of FIG. 1 and FIG. 2. FIG. 1 corresponds to a front view seen from an XZ plane, and FIG. 2 corresponds to a side view seen from a YZ plane.

As illustrated in FIG. 1, in a one-head traveling frame 1 movable in a horizontal direction (X direction), a lifting-lowering servomotor 2 is fixed to a side surface having the XZ plane.

An upper end (+Z direction) of a screw shaft 21 is attached to the lifting-lowering servomotor 2, and a lower end of the screw shaft 21 is attached to a lifting-lowering slider 3 in a manner to be connected to the lifting-lowering slider 3 via a nut that is not illustrated.

In such a configuration, when the screw shaft 21 is rotated in a first rotation direction by driving the lifting-lowering servomotor 2, a lowering operation of moving the lifting-lowering slider 3 downward (−Z direction) can be performed.

On the other hand, when the screw shaft 21 is rotated in a second rotation direction (rotation direction opposite to the first rotation direction) by the lifting-lowering servomotor 2, a lifting operation of moving the lifting-lowering slider 3 upward (+Z direction) can be performed.

In this manner, the lifting-lowering servomotor 2 functions as a lifting-lowering mechanism that combines a lowering mechanism that performs the above-described lowering operation and a lifting mechanism that performs the above-described lifting operation.

As illustrated in FIG. 2, an air cylinder 4 is directly attached to a side surface of the lifting-lowering slider 3 having the XZ plane.

A pressurizing slider 5 is connected to a tip portion of the piston rod 23 of the air cylinder 4. In addition, the air cylinder 4 has a position detection unit 7 in the air cylinder 4 described later in detail.

Then, an ultrasonic welding head unit 6 is attached to a lower region of the pressurizing slider 5. The ultrasonic welding head unit 6 includes an ultrasonic horn 16 and an ultrasonic vibrator 17 as main components, and a tip portion of the ultrasonic horn 16 is an ultrasonic welding portion 16a.

The ultrasonic welding head unit 6 is formed extending in a head formation direction (Y direction) in the order of the ultrasonic vibrator 17 and the ultrasonic horn 16, and has the ultrasonic welding portion 16a on a tip portion of the ultrasonic horn 16.

The ultrasonic welding head unit 6 causes the ultrasonic vibrator 17 to generate ultrasonic vibrations UV, and transmits the ultrasonic vibrations UV to the ultrasonic welding portion 16a via the ultrasonic horn 16, thereby executing an ultrasonic vibration operation of applying ultrasonic vibrations to an application portion of a welding target from the ultrasonic welding portion 16a.

Note that as the welding target, for example, as illustrated in FIG. 2, a glass substrate 31 placed on a table 30 and a linear electrode 33 disposed on an upper surface of the glass substrate 31 are conceivable. A predetermined position on an upper surface of the electrode 33 is an application portion, and ultrasonic welding of the electrode 33 and the glass substrate 31 can be performed on the application portion of the electrode 33 by the ultrasonic vibration operation by the ultrasonic welding head unit 6. Note that the glass substrate 31 is used as a substrate of a solar cell panel or the like.

(Control Unit)

Figure 3:
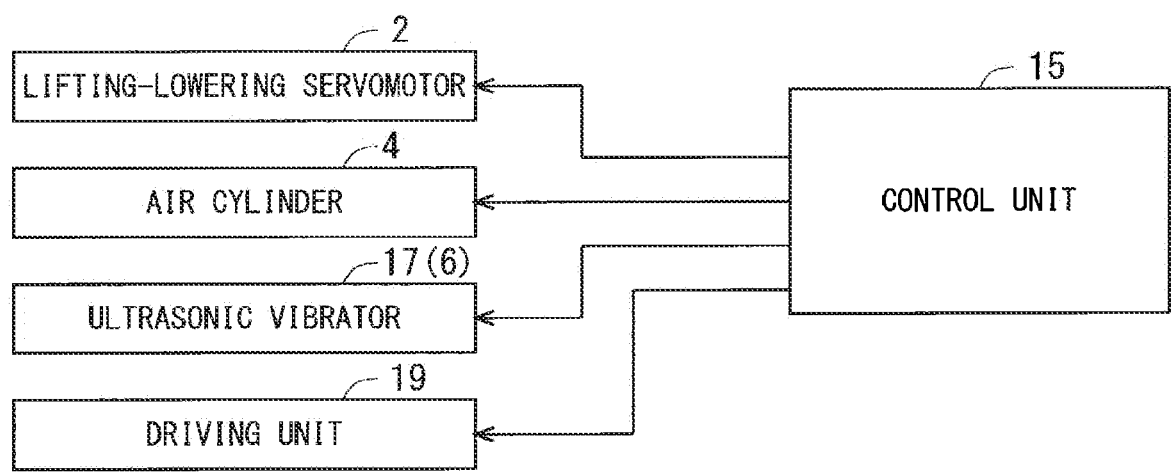
FIG. 3 is a block diagram schematically illustrating a control system of the ultrasonic vibration welding apparatus according to the first embodiment.

FIG. 3 is a block diagram schematically illustrating a control system of the ultrasonic vibration welding apparatus according to the first embodiment. As illustrated in the diagram, the ultrasonic vibration welding apparatus according to the first embodiment further has a control unit 15. The control unit 15 executes a control operation of controlling driving of the lifting-lowering servomotor 2, the air cylinder 4, the ultrasonic vibrator 17 in the ultrasonic welding head unit 6, and the driving unit 19.

Note that the driving unit 19 executes a movement process of moving the one-head traveling frame 1 in the horizontal direction, and the ultrasonic vibrator 17 executes an ultrasonic vibration operation of giving ultrasonic vibrations UV to the ultrasonic welding portion 16a via the ultrasonic horn 16.

The control unit 15 can control a pressing force F1 in the −Z direction by the lifting-lowering servomotor 2 by controlling driving of the lifting-lowering servomotor 2, and can control a pressing force F2 in the −Z direction by controlling the air cylinder 4. At this time, the pressing forces F1 and F2 satisfy the relationship of "F1>F2".

The ultrasonic welding head unit 6 is coupled to the lifting-lowering slider 3 via the pressurizing slider 5, the piston rod 23, and the air cylinder 4. Accordingly, the pressing force F1 in the −Z direction generated at a time of a lowering operation performed by driving the lifting-lowering servomotor 2 is a lowering pressing force in the lowering operation with the ultrasonic welding head unit 6 being an operating target.

The ultrasonic welding head unit 6 is coupled to the air cylinder 4 via the pressurizing slider 5 and the piston rod 23. Accordingly, the pressing force F2 in the −Z direction transmitted to the piston rod 23 of the air cylinder 4 becomes the pressurizing pressing force applied to the ultrasonic welding head unit 6 toward the table 30 side. Thus, the pressurizing pressing force is applied to the ultrasonic welding head unit 6 from the piston rod 23 of the air cylinder 4.

The control unit 15 can control the movement process of the one-head traveling frame 1 along the horizontal direction by controlling the driving unit 19.

Furthermore, the control unit 15 can control the ultrasonic vibration operation of the ultrasonic welding head unit 6 by controlling the ultrasonic vibrator 17.

The ultrasonic vibration welding apparatus according to the first embodiment having such a configuration can execute the ultrasonic welding process constituted of steps S1 to S4 below under control of the control unit 15. That is, the control unit 15 executes the control operation constituted of steps S1 to S4.

step S1: The ultrasonic welding portion 16a of the ultrasonic welding head unit 6 is disposed to be located above the application portion of the welding target.

step S2: The air cylinder 4 is caused to execute a pressurizing operation with the pressing force F2.

step S3: The screw shaft 21 is rotated in the first rotation direction by driving of the lifting-lowering servomotor 2, thereby executing a lowering operation of moving the lifting-lowering slider 3, the air cylinder 4, the pressurizing slider 5, and the ultrasonic welding head unit 6 downward. The lowering operation is executed with the pressing force F1.

Note that the pressing force F1 and the pressing force F2 are set in advance, and during execution of the ultrasonic welding process, the pressing force F1 and the pressing force F2 are controlled to satisfy "F1>F2" and each have a constant pressure value.

step S4: When the position detection unit 7 detects a welding portion contact state in which the lower tip portion of the ultrasonic welding portion 16a of the ultrasonic welding head unit 6 contacts the application portion of the welding target, the ultrasonic welding head unit 6 is caused to execute the ultrasonic vibration operation.

Thus, in step S4, the control unit 15 causes the ultrasonic welding head unit 6 to execute an ultrasonic vibration process with recognition of the welding portion contact state as a trigger.

Figure 4:
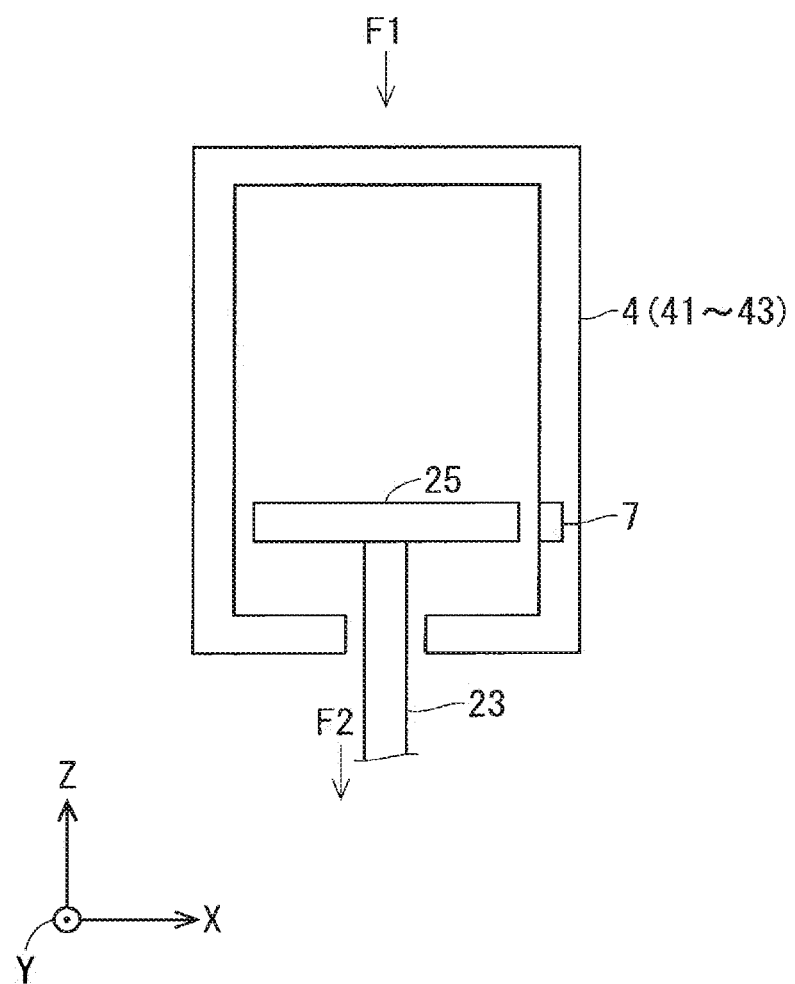
FIG. 4 is an explanatory view (part 1) schematically illustrating an internal state of an air cylinder illustrated in FIG. 1.
Figure 5:
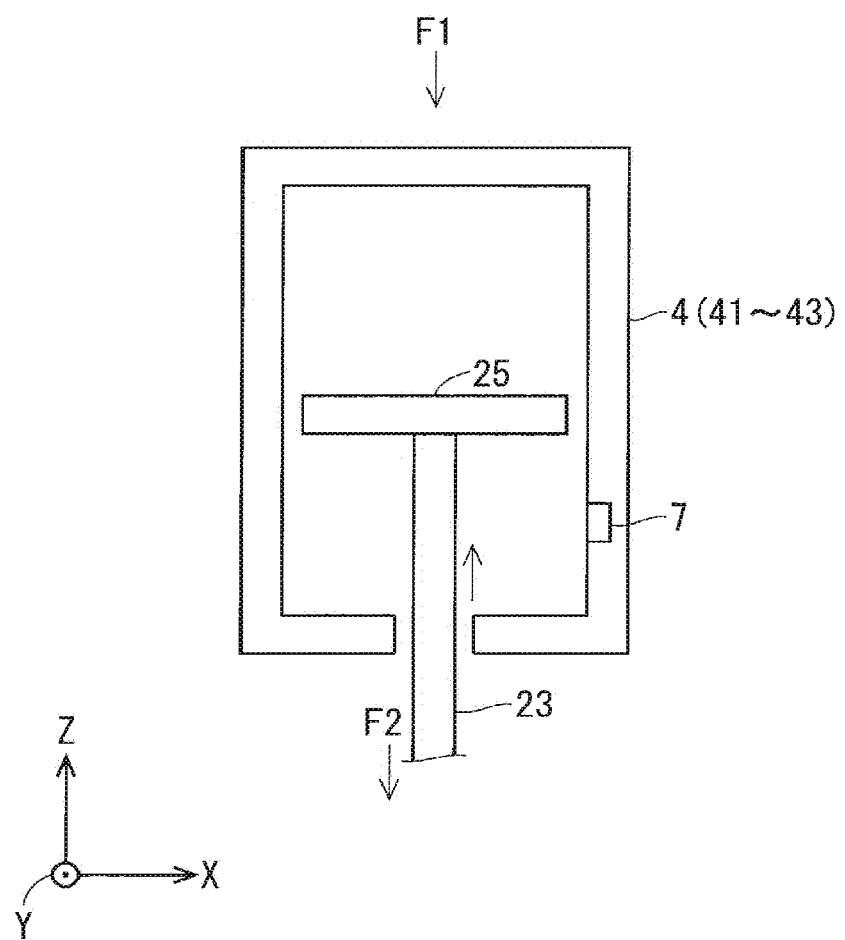
FIG. 5 is an explanatory view (part 2) schematically illustrating an internal state of the air cylinder illustrated in FIG. 1.

FIG. 4 and FIG. 5 are explanatory views schematically illustrating an internal state of the air cylinder 4. FIG. 4 illustrates a status of a welding portion non-contact period, and FIG. 5 illustrates a status after a welding portion contact state. An XYZ orthogonal coordinate system is illustrated in each of FIG. 4 and FIG. 5.

As illustrated in FIG. 4, in the welding portion non-contact period, the air cylinder 4 is in a state that the pressurizing operation of the pressing force F2 by the air cylinder 4 itself is possible while being lowered by the pressing force F1 by the lifting-lowering servomotor 2. At this time, since the ultrasonic welding portion 16a is not in contact with the connection target, the position of the piston 25 is fixed at a predetermined position below the air cylinder 4.

Therefore, a period in which it is detected that the piston 25 is present at the predetermined position by the position detection unit 7 provided on the side surface of the air cylinder 4 is the welding portion non-contact period.

As illustrated in FIG. 5, after the welding portion contact state is established, the lower tip portion of the ultrasonic welding portion 16a abuts on the welding target, and thus the air cylinder 4 stops without being lowered.

At this time, since the pressing force F1>the pressing force F2, the piston 25 is lifted from the predetermined position by this pressure difference (F1−F2).

Therefore, when it is detected by the position detection unit 7 provided on the side surface of the air cylinder 4 that the piston 25 has risen from the predetermined position, it can be recognized that the welding portion contact state is established.

(Effect)

As described above, in the ultrasonic vibration welding apparatus according to the first embodiment, by providing the position detection unit 7 capable of detecting whether a height position in a height direction (Z direction) of the piston 25 in the air cylinder 4 is at a predetermined position or a position higher than the predetermined position, it is possible to quickly and accurately recognize presence or absence of the welding portion contact state after step S3 is executed.

As a result, in step S4, the ultrasonic vibration welding apparatus according to the first embodiment can execute an ultrasonic vibration operation with recognition of the welding portion contact state as a trigger, so as to complete an ultrasonic welding process on the application portion of the welding target, thereby exhibiting an effect that the operating time needed for the ultrasonic welding process can be shortened.

Furthermore, the ultrasonic vibration welding apparatus according to the first embodiment can accurately detect presence or absence of the welding portion contact state with a relatively simple configuration in which the position detection unit 7 is provided in the air cylinder 4.

Therefore, in the ultrasonic vibration welding apparatus according to the first embodiment, it is not necessary to detect presence or absence of the welding portion contact state using a pressure sensor as in the conventional ultrasonic vibration welding apparatus.

Note that the position detection unit 7 is generally provided in the air cylinder 4 and can be implemented relatively inexpensively as compared to a pressure sensor or the like.

As described above, the ultrasonic vibration welding apparatus according to the first embodiment has the air cylinder 4, which is a pressurizing mechanism that executes a pressurizing operation of applying the pressing force F2, which is a pressurizing pressing force to the ultrasonic welding head unit 6, and the lifting-lowering servomotor 2 functioning as a lowering mechanism that executes a lowering operation of lowering the ultrasonic welding head unit 6 as parts separate from each other.

Accordingly, the ultrasonic vibration welding apparatus according to the first embodiment can individually control execution of each of the lowering operation and the pressurizing operation with the ultrasonic welding head unit 6 being an operating target.

As described above, since the ultrasonic vibration welding apparatus according to the first embodiment can individually control execution of each of the lowering operation and the pressurizing operation, the lowering operation and the pressurizing operation with the ultrasonic welding head unit 6 being an operating target can be executed relatively easily under control of the control unit 15, so as to perform the ultrasonic welding process on the welding target.

Note that, as the welding target, as described above, the glass substrate 31 and the electrode 33 disposed on the glass substrate 31 are assumed.

Furthermore, since the air cylinder 4 does not need a function of lowering the ultrasonic welding head unit 6, the pressurizing operation can be executed with the pressing force F2 that is always constant from beginning of the ultrasonic welding process. Accordingly, the pressing force F2 can be set in advance so as to obtain a desired pressure value. Thus, the air cylinder 4 can accurately set the pressure value of the pressing force F2 to the desired pressure value without separately providing a pressure sensor.

Furthermore, the ultrasonic vibration welding apparatus according to the first embodiment can constitute the pressurizing mechanism relatively inexpensively by employing the air cylinder 4 as the pressurizing mechanism.

Second Embodiment (Basic Configuration)

Figure 6:
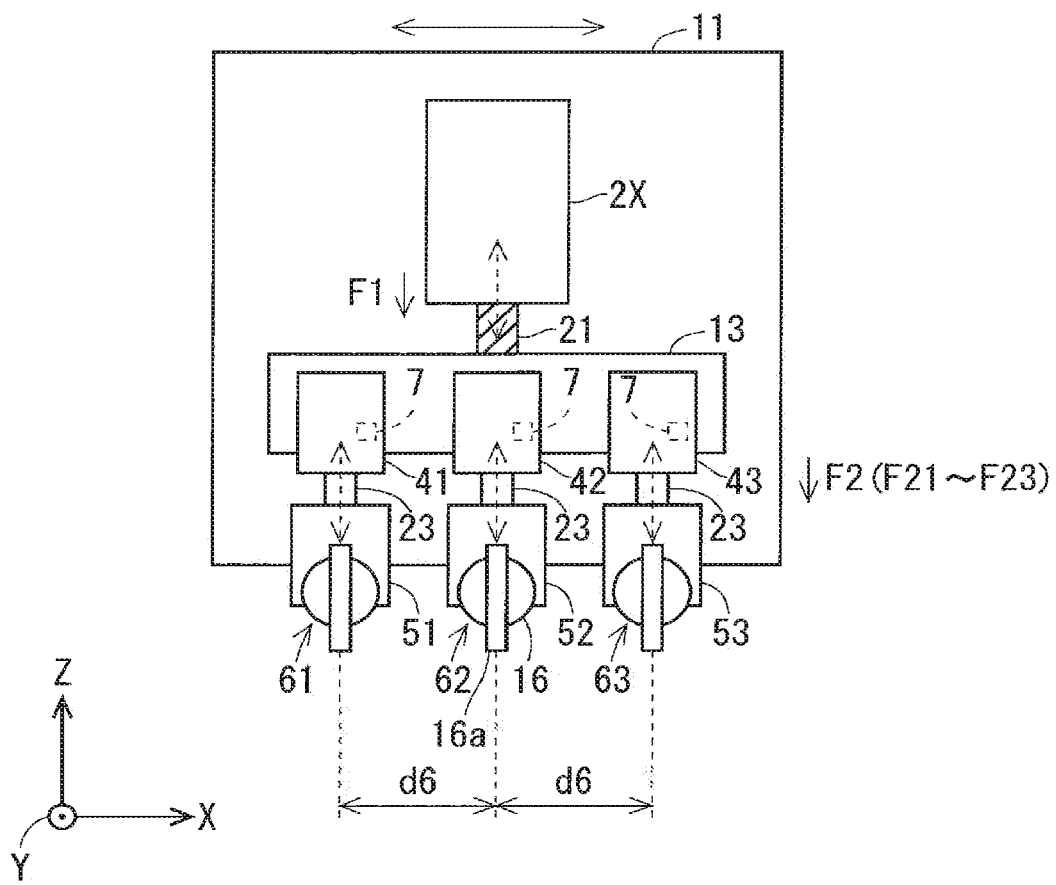
FIG. 6 is an explanatory view schematically illustrating a structure of an ultrasonic vibration welding apparatus according to a second embodiment of the present invention.

FIG. 6 is an explanatory view schematically illustrating a structure of an ultrasonic vibration welding apparatus as a second embodiment of the present invention. An XYZ orthogonal coordinate system is illustrated in FIG. 6.

As illustrated in FIG. 6, in a three-head traveling frame 11 movable in a horizontal direction (X direction), a lifting-lowering servomotor 2X is fixed to a side surface having an XZ plane.

An upper end (+Z direction) of a screw shaft 21 is attached to the lifting-lowering servomotor 2X, and a lower end of the screw shaft 21 is attached to a common lifting-lowering slider 13 in a manner to be connected to the common lifting-lowering slider 13 via a nut that is not illustrated.

In such a configuration, when the screw shaft 21 is rotated in a first rotation direction by driving the lifting-lowering servomotor 2X, a lowering operation of moving the common lifting-lowering slider 13 downward (−Z direction) can be performed.

On the other hand, when the screw shaft 21 is rotated in a second rotation direction (rotation direction opposite to the first rotation direction) by the lifting-lowering servomotor 2X, a lifting operation of moving the common lifting-lowering slider 13 upward (+Z direction) can be performed.

As described above, the lifting-lowering servomotor 2X functions as a lifting-lowering mechanism, which combines a lowering mechanism that performs the above-described lowering operation and a lifting mechanism that performs the above-described lifting operation.

Three air cylinders 41 to 43 are attached to a side surface of the common lifting-lowering slider 13 having the XZ plane.

Three pressurizing sliders 51 to 53 are provided corresponding to the three air cylinders 41 to 43, and a pressurizing slider 5i is coupled to a tip portion of a piston rod 23 of the air cylinder 4i (i=one of 1 to 3). Further, each of the air cylinders 41 to 43 has a position detection unit 7 therein. Note that (i=one of 1 to 3) means (i=any one of 1 to 3) exactly.

Three ultrasonic welding head units 61 to 63 are provided corresponding to the three pressurizing sliders 51 to 53, and an ultrasonic welding head unit 6i is attached to a lower region of the pressurizing slider 5i (i=one of 1 to 3). Each of the ultrasonic welding head units 61 to 63 has an ultrasonic horn 16 (ultrasonic welding portion 16a) and an ultrasonic vibrator 17 as main components, similarly to the ultrasonic welding head unit 6 of the first embodiment.

Each of the ultrasonic welding head units 61 to 63 is formed extending in a head formation direction (Y direction) in the order of the ultrasonic vibrator 17 and the ultrasonic horn 16, and has an ultrasonic welding portion 16a on a tip portion.

The ultrasonic welding portion 16a of the ultrasonic welding head unit 61, the ultrasonic welding portion 16a of the ultrasonic welding head unit 62, and the ultrasonic welding portion 16a of the ultrasonic welding head unit 63 are disposed evenly every interval d6 along the X direction.

Each of the ultrasonic welding head units 61 to 63 causes the ultrasonic vibrator 17 to generate ultrasonic vibrations UV, and transmits the ultrasonic vibrations UV to the ultrasonic welding portion 16a via the ultrasonic horn 16, thereby executing an ultrasonic vibration operation of applying ultrasonic vibrations to an application portion of a welding target from the ultrasonic welding portion 16a.

(Control Unit)

Figure 7:
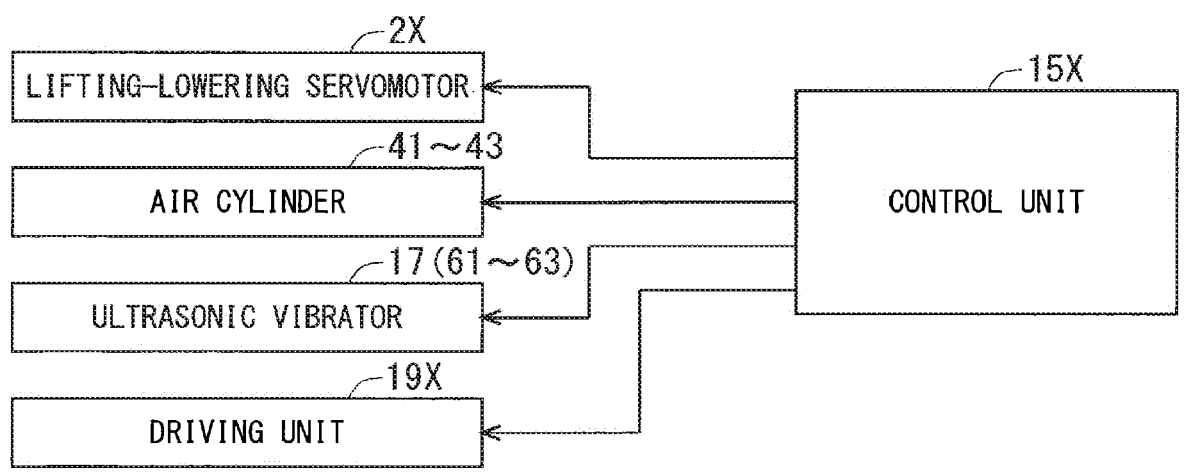
FIG. 7 is a block diagram schematically illustrating a control system of an ultrasonic vibration welding apparatus according to a second embodiment.

FIG. 75 is a block diagram schematically illustrating a control system of the ultrasonic vibration welding apparatus according to the second embodiment. As illustrated in FIG. 7, in the second embodiment, the control unit 15X executes a control operation controlling driving of the lifting-lowering servomotor 2X, the air cylinders 41 to 43, the respective ultrasonic vibrators 17 in the ultrasonic welding head units 61 to 63, and the driving unit 19X.

Note that the driving unit 19X executes a movement process of moving the three-head traveling frame 11 in the horizontal direction. Further, the ultrasonic vibrator 17 of the ultrasonic welding head unit 6i (i=one of 1 to 3) executes an ultrasonic vibration operation of applying ultrasonic vibrations UV to the ultrasonic welding portion 16a via the ultrasonic horn 16.

The control unit 15X can control a pressing force F1 in the −Z direction by the lifting-lowering servomotor 2X by controlling driving of the lifting-lowering servomotor 2X, and can control a pressing force F2 (F21 to F23) of each of the air cylinders 41 to 43 in the −Z direction by controlling each of the air cylinders 41 to 43. The pressing forces F1 and F2 satisfy the relationship of "F1>F2".

The ultrasonic welding head units 61 to 63 are coupled to the common lifting-lowering slider 13 via the pressurizing sliders 51 to 53, the piston rods 23 of the air cylinders 41 to 43, and the air cylinders 41 to 43. Therefore, the pressing force F1 in the −Z direction generated at a time of a lowering operation executed by driving of the lifting-lowering servomotor 2X is a lowering pressing force in a lowering operation common to the ultrasonic welding head units 61 to 63.

Since the ultrasonic welding head unit 6i (i=one of 1 to 3) is coupled to the air cylinder 4i via the pressurizing slider 5i and the piston rod 23 of the air cylinder 4i, a pressing force F2i is a pressurizing pressing force to be applied to the ultrasonic welding head unit 6i by the air cylinder 4i. Note that the pressing forces F21 to F23 are set to satisfy "F21=F22=F23 (=F2)".

The control unit 15X can control a movement process of the three-head traveling frame 11 along the horizontal direction by controlling the driving unit 19X.

Further, the control unit 15X can control the ultrasonic vibration operation of the ultrasonic welding head unit 6i by controlling the ultrasonic vibrator 17 of the ultrasonic welding head unit 6i (i=one of 1 to 3).

The ultrasonic vibration welding apparatus according to the second embodiment having such a configuration can execute the ultrasonic welding process constituted of steps S11 to S14 below under control of the control unit 15X. That is, the control unit 15X executes the control operation constituted of steps S11 to S14.

step S11: The ultrasonic welding portions 16a of the ultrasonic welding head units 61 to 63 are disposed to be located above the three application portions of the welding target.

step S12: The air cylinders 41 to 43 are caused to execute a pressurizing operation with pressing forces F21 to F23.

step S13: The screw shaft 21 is rotated in the first rotation direction by driving the lifting-lowering servomotor 2X, thereby executing a batch multiple lowering operation of moving the common lifting-lowering slider 13, the air cylinders 41 to 43, the pressurizing sliders 51 to 53, and the ultrasonic welding head units 61 to 63 downward at once. At this time, the lifting-lowering servomotor 2X is controlled so that the pressure value in the −Z direction becomes the pressing force F1.

step S14: The position detection unit 7 of the air cylinder 4i (i=one of 1 to 3) detects presence or absence of a welding portion contact state in which the lower tip portion of the ultrasonic welding portion 16a of the ultrasonic welding head unit 6i contacts the application portion of the welding target. Then, when an entire welding portion contact state is recognized in which the welding portion contact state is detected in all the ultrasonic welding head units 61 to 63, each of the ultrasonic welding head units 61 to 63 is caused to execute an ultrasonic vibration operation.

When the position detection unit 7 provided on the side surface of the air cylinder 4i (i=one of 1 to 3) detects that the piston 25 in the air cylinder 4i has risen from the predetermined position as in the first embodiment, it is possible to recognize the welding portion contact state with respect to the ultrasonic welding head unit 6i.

Therefore, when the position detection units 7 of all the air cylinders 41 to 43 detect the welding portion contact state, the control unit 15X can recognize the entire welding portion contact state.

(Effect)

As described above, in the ultrasonic vibration welding apparatus according to the second embodiment, by providing the position detection unit 7 in each of the air cylinders 41 to 43, the entire welding portion contact state can be quickly and accurately recognized after step S13 is executed.

As a result, in step S14, the ultrasonic vibration welding apparatus according to the second embodiment executes an ultrasonic vibration process with recognition of the entire welding portion contact state as a trigger, so as to perform ultrasonic welding quickly on the application portions of the three welding targets, thereby exhibiting an effect that the operation time can be shortened.

Furthermore, the ultrasonic vibration welding apparatus according to the second embodiment can accurately recognize the entire welding portion contact state with a relatively simple configuration in which the position detection unit 7 is provided in the air cylinders 41 to 43.

As described above, the ultrasonic vibration welding apparatus according to the second embodiment has the air cylinders 41 to 43 and the lifting-lowering servomotor 2X, together as parts separate from each other. The air cylinders 41 to 43 are pressurizing mechanisms that execute a pressurizing operation of applying pressing forces F21 to F23 as pressurizing pressing forces to the ultrasonic welding head units 61 to 63. The lifting-lowering servomotor 2X functions as a lowering mechanism that executes a batch multiple lowering operation of lowering the ultrasonic welding head units 61 to 63.

Thus, the ultrasonic vibration welding apparatus according to the second embodiment can individually control execution of each of a lowering operation and a pressurizing operation with the ultrasonic welding head units 61 to 63 being the operating target.

As described above, since the ultrasonic vibration welding apparatus according to the second embodiment can individually execute each of the lowering operation and the pressurizing operation as in the first embodiment, the lowering operation and the pressurizing operation with the ultrasonic welding head units 61 to 63 being the operating target can be executed relatively easily under control of the control unit 15X, so as to perform the ultrasonic welding process on the welding target.

Furthermore, since the air cylinders 41 to 43 do not need to have the function of lowering the ultrasonic welding head units 61 to 63, the pressurizing operation can be executed with the pressing force F21 to F23 that is always constant. Accordingly, the pressing forces F21 to F23 can be set in advance so as to obtain a desired pressure value. Thus, each of the air cylinders 41 to 43 can accurately set each of the pressing forces F21 to F23 to a desired pressure value without separately providing a pressure sensor.

Furthermore, the ultrasonic vibration welding apparatus according to the second embodiment can configure the pressurizing mechanism relatively inexpensively by employing the air cylinders 41 to 43 as the pressurizing mechanism.

In addition, the ultrasonic vibration welding apparatus according to the second embodiment has features below. The second embodiment has three air cylinders 41 to 43 as a plurality of pressurizing mechanisms while restricting the lifting-lowering servomotor 2X, which is a lifting-lowering mechanism, to one. The air cylinders 41 to 43 are provided corresponding to the ultrasonic welding head units 61 to 63 which are a plurality of ultrasonic welding head units.

Therefore, the ultrasonic vibration welding apparatus according to the second embodiment can execute a batch multiple lowering operation with respect to the three ultrasonic welding head units 61 to 63 and the three air cylinders 41 to 43 at once by a lowering operation performed by the lifting-lowering servomotor 2X of one unit.

Accordingly, the ultrasonic vibration welding apparatus according to the second embodiment can implement a configuration having three ultrasonic welding head units 61 to 63 with a relatively small-scale configuration that does not increase the number of lifting-lowering servomotors 2X.

Figure 10:
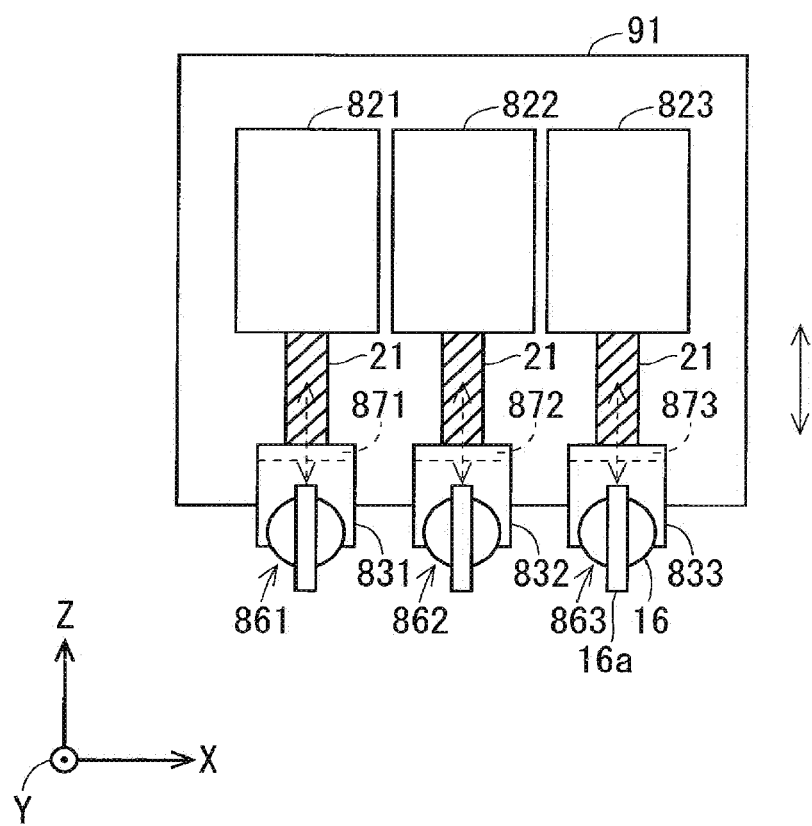
FIG. 10 is an explanatory view schematically illustrating a structure of a conventional pressurizing type ultrasonic vibration welding apparatus having three ultrasonic welding head units.

The above effects will be described in detail below. FIG. 10 is an explanatory view schematically illustrating a structure of a conventional pressurizing type ultrasonic vibration welding apparatus having three ultrasonic welding head units. An XYZ orthogonal coordinate system is illustrated in FIG. 10.

As illustrated in the view, in a three-head traveling frame 91 movable in a horizontal direction (X direction), three lifting-lowering pressurizing servomotors 821 to 823 are fixed to a side surface having an XZ plane. Then, lifting-lowering pressurizing sliders 831 to 833 are provided corresponding to the lifting-lowering pressurizing servomotors 821 to 823.

An upper end (+Z direction) of the screw shaft 21 is attached to a lifting-lowering pressurizing servomotor 82*i* (i=one of 1 to 3), and a lower end of the screw shaft 21 is attached to a lifting-lowering pressurizing slider 83*i* in a manner to be connected to the lifting-lowering pressurizing slider 83*i* via a nut that is not illustrated.

In such a configuration, when the screw shaft 21 is rotated in a first rotation direction by driving the lifting-lowering pressurizing servomotor 82*i* (i=one of 1 to 3), a lowering operation of moving the lifting-lowering pressurizing slider 83*i* downward (−Z direction) can be performed.

On the other hand, when the screw shaft 21 is rotated in a second rotation direction (rotation direction opposite to the first rotation direction) by the lifting-lowering pressurizing servomotor 82*i*, a lifting operation of moving the lifting-lowering pressurizing sliders 83*i* (i=one of 1 to 3) upward (in the +Z direction) can be performed. Ultrasonic welding head units 861 to 863 are provided corresponding to the lifting-lowering pressurizing sliders 831 to 833.

An ultrasonic welding head unit 86*i* is attached to a lower portion of the lifting-lowering pressurizing slider 83*i* (i=one of 1 to 3). The ultrasonic welding head unit 86*i* is formed extending in a head formation direction (Y direction), and has an ultrasonic welding portion 16*a* on a tip portion.

Each of the ultrasonic welding head units 861 to 863 executes an ultrasonic vibration operation of applying ultrasonic vibrations from the ultrasonic welding portion 16*a*.

In addition, the lifting-lowering pressurizing sliders 831 to 833 have pressure sensors 871 to 873 in upper parts thereof. As the pressure sensors 871 to 873, for example, strain gauges are conceivable. The pressure sensor 87*i* (i=one of 1 to 3) can detect, as a measured pressure value, a pressurizing pressing force of the ultrasonic welding head unit 86*i* pressing the welding target.

The lowering operation and the lifting operation of each of the lifting-lowering pressurizing servomotors 821 to 823 described above and the ultrasonic vibration operation of each of the ultrasonic welding head units 861 to 863 are executed under the control of a control unit that is not illustrated.

In the conventional ultrasonic vibration welding apparatus having such a configuration, the following steps 11 to 14 are executed under control of the control unit.

step 11: The ultrasonic welding portions 16*a* of the ultrasonic welding head units 861 to 863 are disposed to be located above the three application portions of the welding target.

step 12: The screw shaft 21 is rotated in the first rotation direction by driving the lifting-lowering pressurizing servomotor 82*i* (i=one of 1 to 3), thereby executing a lowering operation of moving the lifting-lowering pressurizing slider 83*i* and the ultrasonic welding head unit 86*i* downward.

step 13: When the pressure sensor 87*i* (i=one of 1 to 3) detects presence or absence of a welding portion contact state in which the ultrasonic welding portion 16*a* of the ultrasonic welding head unit 86*i* contacts an application portion of the welding target, a driving content of the lifting-lowering pressurizing servomotor 82*i* is controlled so that a pressurizing pressing force by the ultrasonic welding head unit 86*i* becomes a desired pressure value.

step 14: After it is confirmed that all the pressurizing pressing forces of the lifting-lowering pressurizing servomotors 821 to 823 have become a desired pressure value, each of the ultrasonic welding head units 861 to 863 is caused to execute an ultrasonic vibration operation.

As described above, in the conventional ultrasonic vibration welding apparatus, when the three ultrasonic welding head units 861 to 863 are provided, it is necessary to provide three lifting-lowering pressurizing servomotors 821 to 823 corresponding to the ultrasonic welding head units 861 to 863.

On the other hand, in the ultrasonic vibration welding apparatus according to the second embodiment, the pressurizing mechanism (air cylinders 41 to 43) and the lifting-lowering mechanism (lifting-lowering servomotor 2X) are provided separately.

Accordingly, the ultrasonic vibration welding apparatus according to the second embodiment can be configured, even if three ultrasonic welding head units 61 to 63 are provided, in a mode that the lifting-lowering mechanism is restricted to one unit of lifting-lowering servomotor 2X, and in the pressurizing mechanism only the number of air cylinders is increased.

Furthermore, since the ultrasonic vibration welding apparatus according to the second embodiment has the three ultrasonic welding head units 61 to 63 as a plurality of ultrasonic welding head units, as compared with the ultrasonic vibration welding apparatus according to the first embodiment having a single ultrasonic welding head unit, when a plurality of application portions of a welding target exist, an ultrasonic welding process for all the plurality of application portions can be completed earlier.

Figure 8:
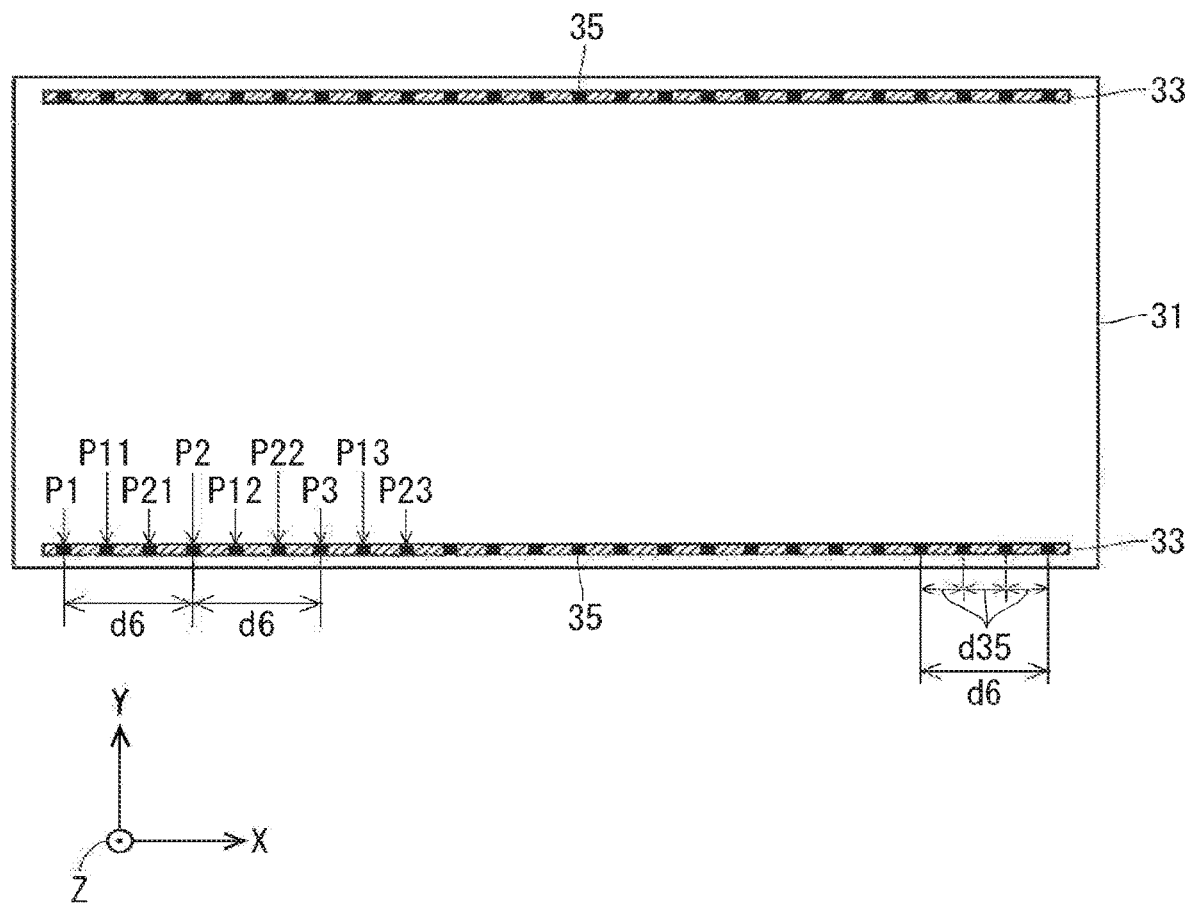
FIG. 8 is an explanatory view illustrating a specific configuration of a welding target.

This point will be described in detail below. FIG. 8 is an explanatory view illustrating a specific configuration of a welding target. As illustrated in the view, two linear electrodes 33 are disposed on an upper surface of the glass substrate 31 along the X direction. A plurality of ultrasonic wave application areas 35 are set, which are a plurality of application portions in two electrodes 33. The plurality of ultrasonic wave application areas 35 are equally provided at intervals d35 along the X direction.

Here, it is assumed that the relationship of "d6=3~d35" is established between a formation interval d6 among the ultrasonic welding head units 61 to 63 and the distance d35 among the plurality of ultrasonic wave application areas 35.

In this case, in step S11 described above, as illustrated in FIG. 8, the ultrasonic welding portion 16a of the ultrasonic welding head unit 61 is disposed to be located above an application position P1, the ultrasonic welding portion 16a of the ultrasonic welding head unit 62 is disposed to be located above an application position P2, and the ultrasonic welding portion 16a of the ultrasonic welding head unit 63 is disposed to be located above an application position P3.

Since the application positions P1, P2, and P3 are application positions arranged at intervals of three ultrasonic wave application areas 35, each of intervals between the application positions P1 to P2 and P2 to P3 is the formation intervals d6.

Thereafter, by executing steps S12 to S14 described above, ultrasonic welding of the glass substrate 31 and the electrode 33 can be performed on the three ultrasonic wave application areas 35 (application positions P1 to P3) by one ultrasonic welding process constituted of steps S11 to S14.

At a time of a next ultrasonic welding process, the lifting-lowering servomotor 2X is driven to perform a lifting operation, and the ultrasonic welding head units 61 to 63 are lifted to be released from the entire welding portion contact state. Thereafter, in step S11, which is newly executed, the driving unit 19X is controlled to move the three-head traveling frame 11 along the +X direction by an interval d35.

Then, as illustrated in FIG. 8, the ultrasonic welding portion 16a of the ultrasonic welding head unit 61 is disposed to be located above an application position P11, the ultrasonic welding portion 16a of the ultrasonic welding head unit 62 is disposed to be located above an application position P12, and the ultrasonic welding portion 16a of the ultrasonic welding head unit 63 is disposed to be located above an application position P13.

Thereafter, by executing steps S2 to S14 described above, ultrasonic welding of the glass substrate 31 and the electrode 33 can be performed on the three ultrasonic wave application areas 35 (application positions P11 to P13) by a second ultrasonic welding process constituted of steps S11 to S14.

Further, at a time of a next ultrasonic welding process, the lifting-lowering servomotor 2X is driven to perform a lifting operation, and the ultrasonic welding head units 61 to 63 are lifted to be released from the entire welding portion contact state. Thereafter, in step S11, which is newly executed, the three-head traveling frame 11 is moved along the +X direction by an interval d35.

Then, as illustrated in FIG. 8, the ultrasonic welding portion 16a of the ultrasonic welding head unit 61 is disposed to be located above an application position P21, the ultrasonic welding portion 16a of the ultrasonic welding head unit 62 is disposed to be located above an application position P22, and the ultrasonic welding portion 16a of the ultrasonic welding head unit 63 is disposed to be located above an application position P23.

Thereafter, by executing steps S12 to S14 described above, ultrasonic welding of the glass substrate 31 and the electrode 33 can be performed on the three ultrasonic wave application areas 35 (application positions P21 to P23) by a third ultrasonic welding process constituted of steps S11 to S14.

As a result, ultrasonic welding of the glass substrate 31 and the electrode 33 can be performed on the nine ultrasonic wave application areas 35 continuously provided at the intervals d35 by three times of the ultrasonic welding processes.

Thus, the ultrasonic vibration welding apparatus according to the second embodiment exhibits an effect to be capable of executing the ultrasonic welding process substantially three times as speedily as that in the ultrasonic vibration welding apparatus of the first embodiment by a relatively simple and inexpensive configuration in which the lifting-lowering servomotor 2X, which is a lifting-lowering mechanism, is restricted to one unit.

As a result, the ultrasonic vibration welding apparatus according to the second embodiment can shorten a tact time for completing all the ultrasonic welding processes on the welding target.

<Others>

Although the present invention has been described in detail, the above description is illustrative in all aspects, and the present invention is not limited thereto. It is understood that innumerable modifications not illustrated can be envisaged without departing from the scope of the present invention.

The invention claimed is:

1. An ultrasonic vibration welding apparatus, comprising:
   a table on which a welding target is placed;
   an ultrasonic welding head unit that executes an ultrasonic vibration operation of applying ultrasonic vibrations from an ultrasonic welding portion;
   a pressurizing mechanism that is coupled to said ultrasonic welding head unit and executes a pressurizing operation of pressurizing said ultrasonic welding head unit toward a side of said table;
   a lowering mechanism that executes a lowering operation of lowering said ultrasonic welding head unit and said pressurizing mechanism at once; and
   a control unit configured to execute a control operation of controlling said ultrasonic vibration operation by said ultrasonic welding head unit, said pressurizing operation by said pressurizing mechanism, and said lowering operation by said lowering mechanism, wherein said ultrasonic welding head unit includes a plurality of ultrasonic welding head units, said pressurizing mechanism includes a plurality of pressurizing mechanisms provided corresponding to said plurality of ultrasonic welding head units, said plurality of pressurizing mechanisms each executes said pressurizing operation on the corresponding ultrasonic welding head unit among said plurality of ultrasonic welding head units, said lowering operation executed by said lowering mechanism includes a batch multiple lowering operation of lowering said plurality of ultrasonic welding head units and said plurality of pressurizing mechanisms at once, said control unit configured to causes each of said plurality of ultrasonic welding head units to execute said ultrasonic vibration operation with, as a trigger, recognition of an entire welding portion contact state, said entire welding portion contact state is a state where said plurality of ultrasonic welding head units all contact application portions of said welding target by said lowering operation of said lowering mechanism, by said configured control unit, said lowering mechanism executes said lowering operation with a lowering pressing force, each of said plurality of pressing mechanisms executes said pressurizing operation with a pressurizing pressing force, said lowering pressing force is set to be larger than said pressurizing pressing force, said lowering mechanism continuously executes said lowering operation during executing said ultrasonic vibration operation by each of said plurality of ultrasonic welding head units, and each of said lowering pressing force and said pressurizing pressing force is set to a constant pressure value in advance, and said lowering pressing force and said pressurizing pressing force are maintained during executing said ultrasonic vibration operation by each of said plurality of ultrasonic wielding head units.

2. The ultrasonic vibration welding apparatus according to claim 1, wherein
said pressurizing mechanism includes an air cylinder, and said air cylinder is coupled to said ultrasonic welding head unit via a piston rod, and
said pressurizing pressing force is applied from the piston rod of said air cylinder to said ultrasonic welding head unit.

3. The ultrasonic vibration welding apparatus according to claim 2, wherein
said control operation performed by said control unit includes the steps of:
  (a) arranging said ultrasonic welding portion of each of said plurality of ultrasonic welding head units to be located above an application portions of said welding target;
  (b) causing each of said plurality of pressurizing mechanisms to execute said pressurizing operation;
  (c) causing said lowering mechanism to execute said lowering operation; and
  (d) causing each of said plurality of ultrasonic welding head units to execute said ultrasonic vibration operation with, as a trigger, recognition of said entire welding portion contact state.

4. The ultrasonic vibration welding apparatus according to claim 3, wherein
said air cylinder further has a position detection unit that detects a position of a piston inside the air cylinder.

5. The ultrasonic vibration welding apparatus according to claim 1, wherein said welding target includes:
a glass substrate; and
an electrode disposed on said glass substrate.

* * * * *